United States Patent [19]

Bonifert et al.

[11] Patent Number: 4,749,945
[45] Date of Patent: Jun. 7, 1988

[54] TEST EQUIPMENT FOR PRINTED CIRCUIT BOARDS

[75] Inventors: Reinhard Bonifert, Stockerau; Helmut Hainzl, Wien, both of Austria

[73] Assignee: ITT Austria Gesellschaft GmbH, Vienna, Austria

[21] Appl. No.: 934,720

[22] Filed: Nov. 25, 1986

[51] Int. Cl.⁴ .............................................. G01R 31/02
[52] U.S. Cl. .............................. 324/158 F; 324/73 PC
[58] Field of Search .......... 324/158 F, 73 PC, 158 P, 324/72.5

[56] References Cited

FOREIGN PATENT DOCUMENTS 0056176 3/1984 Japan ................................ 324/158 F
0120968 7/1984 Japan ................................ 324/158 F Primary Examiner—Ernest F. Karlsen
Attorney, Agent, or Firm—Spencer & Frank

[57] ABSTRACT

Test equipment for printed circuit boards including a spring-loaded contact fingers arranged in pre-determined distribution on a contact bearing plate. The contact fingers can be elevated above a contact selecting plate. The respective contact fingers not required for the testing engage into through plated holes in contact selecting plate. The contacting of the elevated contact fingers with the test equipment is effected via printed circuits arranged on contact selecting plate, which results in a substantially plane surface of the contact selecting plate without protruding contact fingers etc., making simple storage of the contact selecting plate as well as automatic adaptation of the equipment possible.

13 Claims, 2 Drawing Sheets

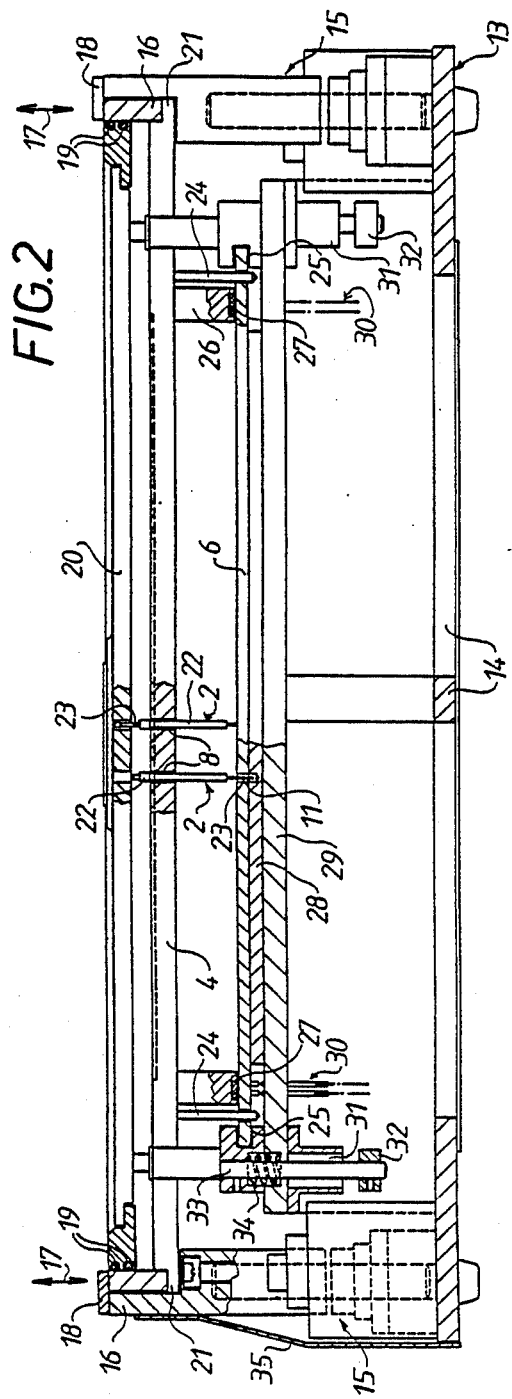

TEST EQUIPMENT FOR PRINTED CIRCUIT BOARDS

BACKGROUND OF THE INVENTION

The present invention relates to equipment for the testing of printed circuit boards (PCB's) for electronic circuits.

More specifically, the invention pertains to printed circuit test equipment of the type having spring loaded contact fingers distributed on a contact-bearing plate and having a contact selecting plate which, according to the type of circuit to be tested, lets predetermined ones of the contact fingers protrude, whereby the contact fingers can be set to the particular printed circuit board.

Various types of equipment for testing printed circuit boards by establishing an electric contact between certain contact lands and contact fingers which can be connected with test equipment are known from DE-AS 26 57 910, DE-AS 22 43 457, DE-OS 33 11 977, CH-PS 633 403. In these types of equipment, contact-bearing plates are used which, due to their permanent arrangement of the contact fingers, cannot be used except for a single type of printed circuit board, or as in DE-AS 22 43 457 require expensive adaptations for other types of printed circuit boards. The expense for the production of test-specific substitution parts for the adaptation of the equipment is relatively high. This is a prticular disadvantage if a small number of printed circuit boards are to be produced and tested.

A further disadvantage of the above-mentioned conventional equipment is that separate wiring is necessary for each of the contact fingers, which are arranged on the contact-bearing plate according to the requirements of the type of PCB to be tested, with the test equipment or an adapter which connects the test equipment with the PCB. Even utilizing the so-called wire-wrap-technique, such wiring is expensive. Furthermore, large numbers of substitution sets are required for a certain type of printed circuit boards and such sets may in some instances have to be stored for decades for various applications.

Recently equipment of the above-mentioned type has become known, in which the contact fingers are arranged on the contact bearing plate in a pre-determined distribution, i.e. in a regular matrix arrangement with a standardized distance (module). The selection of the contact fingers necessary for the testing of a specific type of printed circuit board is effected via a contact selecting plate which is equipped with fixed selecting fingers. These selecting fingers are also arranged according to the basic matrix, but only at the locations of those contact fingers which are necessary for the respective test. In the assembled state of contact bearing plate and contact selecting plate, the contact fingers necessary for the testing are released from a rest position to contact with a printed circuit board to which the arrangement is set by producing underpressure. The contacting of the contact fingers used for the testing of the printed circuit board with the test equipment or the interface respectively, etc., in these conventional arrangements is effected by the wiring of the respective selecting fingers, which again results in the disadvantages already mentioned.

Thus, the number of substitution parts of the equipment necessary for each kind of printed circuit boards to be tested is reduced, and moreover, the substitution parts are less complicated as well. In addition to the above-mentioned disadvantage of wiring necessity the problems concerning storage of the substitution parts are also similar to those of other equipment already mentioned, because the contact-selecting plate with the selecting fingers—in order to prevent damage—either has to be packed accordingly or stored at a proper distance to the other substitution parts.

A further disadvantage is that the protruding contact fingers at the contact selecting plate make it much more difficult to adapt the equipment automatically for the testing of another type of printed circuit boards or in practice even make it impossible to adapt the equipment accordingly, thus requiring expensive manual adaptation.

SUMMARY OF THE INVENTION

It is one object of the present invention to improve such test equipment such that the disadvantages of the known equipment do not occur, and that production and adaptation of substitution prts for various kinds of printed circuit boards to be tested becomes simple and less expensive. Moreover, the layout of the components necessary for adaptation to different circuit boards should be such as to make simple storage taking up less room possible without causing the danger of functional disturbance.

In accordance with the invention contacts at contact lands interact with the protruding contact fingers of the contact selecting plate and are connected with the test equipment via conductive paths on the contact selecting plate. Enlarged contact selecting plate recesses are provided opposite contact fingers at the contact lands interacting with them.

In accordance with the invention the contact selecting plate, the only essential part which has to be substituted for the testing of the various types of printed circuit boards, does not have any elevations, fingers etc. This enables room-saving storage of these substitution parts. Due to the manner of effecting the required contact from the contact fingers to the test equipment, a very simple manner of production of the contact selecting plate by the aid of the same techniques which are applied for the production of the printed circuit boards themselves—etched wiring, conductive coating, etc.—is possible as well, whereby complicated wiring is eliminated. Considerable advantage results from the fact, that except for the contacts and the appropriate printed circuit boards the surface of the contact selecting plate is completely plane, and that therefore automatic adaptation for the testing of other types of printed circuit boards is made possible without having to take into consideration protruding pins or other sensitive elevations.

In accordance with a preferred embodiment of the invention, through plated holes are provided for at the contact selecting plate. The holes are arranged according to the matrix of the contact fingers of the contact bearing plate, whereby the contacts on the contact selecting plate which interact with the respective contact fingers are made by the conductive plugs of the respective holes. By this a further simplification of the production of the equipment and the exchangeable contact selecting plate in particular can be attained, because the contacts to be mounted for the respective protruding contact fingers differ from the through plates holes only by the conductive plugs.

In this connection, according to another version of the present invention, the conductive plugs can be formed by soldering closed the through plated holes. This guarantees a simple manufacturing process as well as reliable operation of the equipment.

According to a further version of the invention the conductive paths on the surface of the contact selecting plate not facing the contact fingers can be connected with the contact lands at the other surface (which faces the contact fingers) via the through plated hole which brings about extremely stable contacts at the contact selecting plate and a reliable connection with the conductive paths to test equipment or adapter, respectively.

In a simple version the taps required for the testing are drawn via the conductive paths on the contact selecting plate out to the edge of this contact selecting plate. Thus not only the cost of production is kept low, but the outstanding feature of these contact selecting plates is that no parts protrude beyond their surface.

A further version of the invention provides for the respective protruding contact fingers being spring-clamped with the contacts of the contact selecting plate in the ready-for-testing-state of contact bearing plate and contact selecting plate, a method, which guarantees in a simple manner safe contact between the respective contact fingers necessary for the testing and the appropriate contact lands at the contact selecting plate.

BRIEF DESCRIPTION OF THE DRAWING

The invention will be better understood from a reading of the following detailed description in conjunction with the drawing in which:

FIG. 2 is a schematic cross section through part of another type of test equipment according to the invention.

DETAILED DESCRIPTION OF THE PREFERRED EMBODIMENTS

Figure 1:
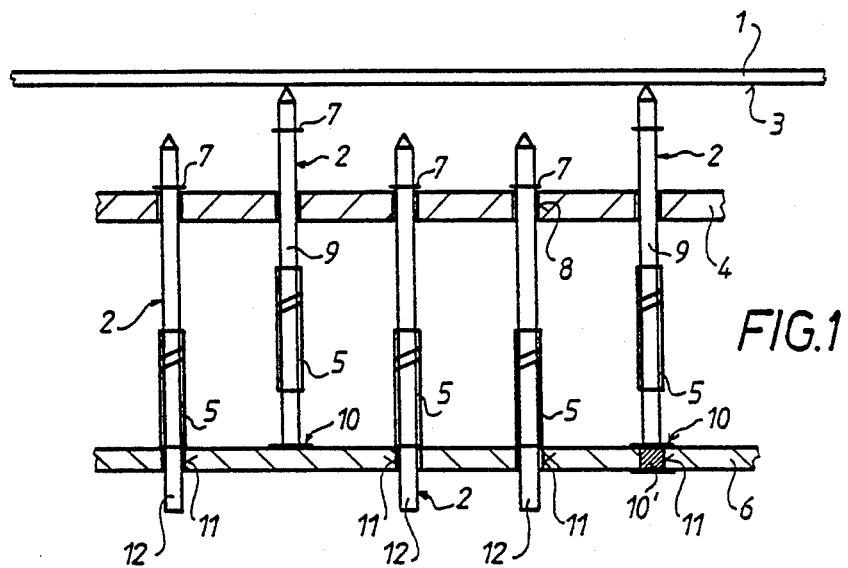
FIG. 1 is a schematic view of equipment according to the invention.

Test equipment according to the schematic diagram in FIG. 1 serves for the testing of printed circuit board 1, as it is now used increasingly for constructing electronic circuits etc. This printed circuit board is at least at one of its surfaces, i.e. at least at surface 3 which faces the contact fingers, equipped with conductive paths (printed circuits), which are produced by means of the printing- and etched-wiring technique; these printed circuits are not shown in the diagram.

This equipment for the testing of printed circuit board 1 includes a contact bearing plate 4 with contact fingers 2, which are arranged in a pre-determined and, in this example, a regular distribution and, via respective spring casings 5, are pre-stressable to determine their length. The equipment also includes a contact selecting plate 6 as well as a tester which, however, is not shown in this diagram. According to the type of test equipment depicted in the diagram, each contact finger is guided safely via a corresponding collar 7 and spring casing 5 into a corresponding hole 8 of the contact bearing plate 4, whereby these holes 8 are arranged in a regular matrix whose width of mesh is according to a certain so-called module which corresponds to the matrix or the module of the printed or etched-wiring circuit on printed circuit board 1, respectively. The spring casings 5 may, however, as well be firmly integrated into the contact bearing plate, whereby then springy contact fingers are set into both ends of spring casings 5.

In order to be able to choose or elevate those contact fingers from the arrangement of the contact fingers 2 which are necessary for the testing of a certain type of printed circuit boards, the contact selecting plate 6 shows at spots which have to be elevated and then—relative to the other contact fingers—are protruding and interacting with the contact fingers 9, contacts 10, which via printed circuits on the contact selecting plate 6 that are not depicted in the diagram are connected with the test equipment, thus enabling via the adjoining contact fingers 9 a contacting of the respective required spots at printed circuit board 1. Thus it is, for example, possible to test whether a certain printed circuit running on printed circuit board 1 between the points where the contact fingers 9 are adjoining is passing through and shows no errors or whether the components switched between these points function properly. Those of the contact fingers 2 which are not required for the respective type of printed circuit board to be tested are interacting with points of contact selecting plate 6 which relative to the dimensions at that point of the contact fingers 2 show enlarged through plated holes 11 so that the lower ends 12 of these contact fingers 2 pass through the contact selecting plate 6 without contacting it and are only stopped by stops, in this case by spring casings 5 or collars 7 respectively.

The arrangement discussed above and depicted in the diagram has the considerable advantage that for the adaptation of equipment for the testing of another type of printed circuit boards only contact selecting plate 6, which except for the contacts 10 and the adjoining printed circuits is completely plane and apart of this, shows as an interruption of the plane surface only the through plated holes 11, has to be exchanged, which, according to the basic view shown in the diagram, can be effected in a very simple way by appropriate enlargement of the relative distance between contact bearing plate 4 and contact selecting plate 6.

Various such contact selecting plates can be stapled in a very simple way, not taking up much place by lying close to one another: besides the advantage of simplification of adaptation this results in simplified storage.

To the left of the two contact fingers 9 elevated by contact selecting plate 6 contact 10 is simply running at the upper surface of the contact selecting plate, and it is directly connected with circuits printed thereon, which are not depicted in the diagram. Compared to this, at the right elevated contact finger 9 a type of test equipment is depicted according to which the contact selecting plate 6 is fitted with the same through plated holes 11 in the same hole pattern as contact bearing plate 4, whereby the contacts 10 interacting with the respective protruding contact fingers 9 are formed by conductive plugs 10' of the through plated holes 11 belonging to them. These conductive plugs 10' can in a very simple manner be formed by soldering-closed through plated holes. With this type of equipment it is possible that at the surface of contact selecting plate 6 not facing contact bearing plate 4 printed circuits are running as well.

For further details of this equipment the merely principal configuration of which is depicted in FIG. 1 refer to FIG. 2, which shows complete equipment for the testing of printed circuit boards.

At a basic frame 13 which is reinforced by central bars 14 in this example of a configuration pneumatically operating fluid-cylinder arrangements 15 are mounted which are used for elevating and lowering a supporting frame 16 in the direction of arrows 17. Supporting frame 16 is fixed over laths 18 and carries at its inner edge a supported frame being sealed by seals 19 and carrying an inserted supporting plate 20 at its edge. In the state of operation of the equipment this supporting plate is a support and seal for the printed circuit boards to be tested which are not depicted in the diagram.

Below supporting plate 20 contact bearing plate 4 is mounted which at its edge 21 by the supporting frame 16 and the laths 18 is fixed to fluid cylinder arrangement 15. Here again, the contact fingers 2 are inserted into the holes 8 of contact bearing plate 4 in regular distribution (matrix with a width of mesh of one module), these contact fingers showing here outer casing 22 fixed in the hole 8, whereby casing 22 at its upper and lower end each has a finger 23 which is shiftable in longitudinal direction and spring-guided.

Below contact bearing plate 4 contact selecting plate 6 is arranged, which is fixed in its relative position to contact bearing plate 4 by pin arresters 24; after contact bearing plate 4 has been lifted off, contact selecting plate 6 can be slipped out with supporting plate 20 via the fluid cylinder arrangements 15 along guide paths 25 and exchanged as well. At the inner side of pin arresters 24 (as appears in the diagram) spacer ring 26 with sealing ring 27 can be recognized, which make the sealing of the space between the contact bearing plate 4 and contact selecting plate 6 possible.

Below contact selecting plate 6 a sealing plate 28 is provided for which is resting directly on a supporting table 29 of the equipment thus sealing through plated holes 11 of the contact selecting plate 6. Supporting table 29 shows the connecting contacts 30, which are interacting with the printed circuits on contact selecting plate 6, thus allowing test equipment to be connected; this is not depicted in detail in the diagram.

At the outer edges of supporting table 29 transversal ball bearings 31 for guiding pins 33 carrying terminal stops 32 are mounted, whereby reset springs 34 are provided for around these guiding pins 33, which are acting between the component carrying the guiding paths 25 for contact selecting plate 6 on the one hand and supporting table 29 on the other hand. For the reason of completeness it has to be referred to a covering plate 35 which is only depicted on the left side of FIG. 2 and which is fixed to basic frame 13, overlapping fluid cylinder arrangements 15.

Before equipment as depicted in the diagram is set to work, the upper part of it including supporting plate 20 and contact bearing plate 4 is elevated by the rest springs 34. Thereby it is possible to insert a contact selecting plate 6 into the guiding paths 25 manually or automatically. Then via fluid cylinder arrangement 15 the lowering of the upper part of the equipment including supporting plate 20 and contact bearing plate 4 is effected, whereby the pin arresters 24 are getting engaged with appropriate holes at the edges of contact selecting plate 6 and adjust contact selecting plate 6 exactly. The pins 23 of the contact fingers 2 can only pass through contact selecting plate 6 at points where through plated holes 11 are provided for in this contact selecting plate 6. At the remaining points of interaction between contact fingers 2 and the surface of contact selecting plate 6 contacts are fixed and appropriate circuits are printed, which via connecting contacts 30 bring about a connection from test equipment not depicted in the diagram to the contact lands at the printed circuit board to be tested. After the printed circuit board which has to be tested has been put in place, the space below down to sealing plate 28 is evacuated, whereby supporting plate 20 including laid-on printed circuit board is lowered relative to contact bearing plate 4 and contact fingers 2 respectively and safe contacting of the respective points of the printed circuit board by the protruding contact fingers is effected. After the testing has been finished, the vacuum is refilled, which effects supporting plate 20 to be re-elevated by reset springs which are not depicted in the diagram; now the tested printed circuit board can be removed.

Figure 3:
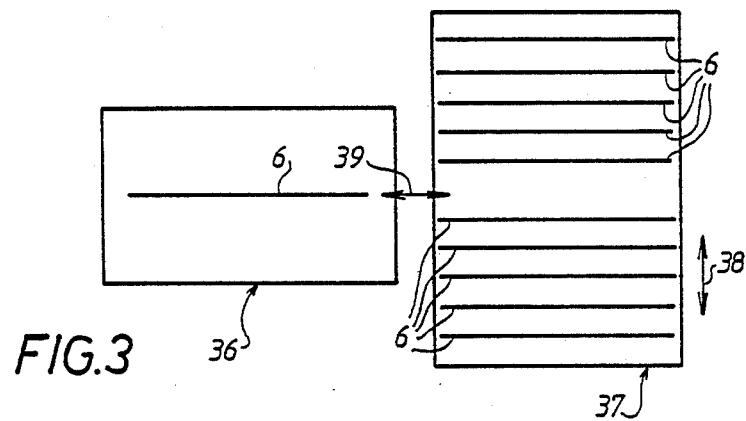
FIG. 3 illustrates a further type of test equipment according to the invention with an arrangement for the automatic substitution of the contact selecting plates.

In FIG. 3 equipment according to FIG. 2 is depicted merely schematically and indicated by 36. Beside equipment 36 a batch-type depot 37 is arranged which can be moved relative to equipment 36 in the direction of double arrow 38 and depending on its position arranges a certain contact selecting plate 6 to insert it automatically into equipment 36 (or into guiding paths 25 according to FIG. 2, respectively). The movement of the selected contact selecting plate 6 alongside arrow 39 can for example be effected via a roller drive etc. Thus automatic adaptation of equipment 36 for the testing of different types of printed circuit boards is made possible, which is facilitated considerably by the fact that the contact selecting plates 6 do not show any elevations, pins, etc.

What is claimed is:

1. In test equipment for testing of printed circuit boards for electronic circuits, said equipment comprising:
    spring-loaded contact fingers arranged in pre-determined distribution at a contact bearing plate; and
    a contact selecting plate which according to the type of printed circuit boards to be tested in the assembled state lets protrude certain contact fingers relative to the rest of them, whereby for the execution of the test the contact fingers can be set to the printed circuit board and connected conductively with the test equipment;
    contacts on said contact selecting plate at points interacting with said protruding contact fingers;
    printed circuits printed on said contact selecting plate for connecting said contacts with said test equipment; and
    enlarged recesses in said contact selecting plate at second points interacting with the other contact fingers relative to the dimensions of ones of said contact fingers at said second points;
    the improvement wherein said contact selecting plate includes electrically conductive through plated holes arranged in a pattern according to the matrix of the arrangement of said contact fingers and forming said enlarged recesses and, ones of said contacts interacting with respective protruding ones of said contact fingers at said contact selecting plate comprise conductive plugs in the respective through plated holes.

2. Equipment in accordance with claim 1, wherein:
    said conductive plugs are formed by soldering-closed said through plated holes.

3. Equipment in accordance with claim 2, wherein:
    said printed circuits printed onto one surface of said contact selecting plate are connected with the contacts on its other surface via said through plated holes.

4. Equipment in accordance with claim 1, comprising:
conductive paths printed onto said contacts selecting and extended to the edge of said contacts selecting plate as taps.

5. Equipment in accordance with claim 1, wherein:
said contact fingers in the ready-for-testing assembled state of said contact bearing plate and said contact selecting plate are spring-clamped towards said contacts of said contact selecting plate.

6. A device for coupling test equipment for testing printed circuit boards for electronic circuits to a circuit board to be tested, comprising:
a contact bearing plate;
spring loaded contact fingers, located in a predetermined matrix arrangement at said contact bearing plate and having front ends for contacting a printed circuit board to be tested;
a contact selecting plate in an opposing position opposing said contact bearing plate;
enlarged conductively plated through holes located in said contact selecting plate in a pattern according to said matrix arrangement in alignment with said holes;
conductive plugs disposed in and in electrical contact with a selected group of said plated holes so as to form contacts electrically contacting a corresponding group of said fingers aligned therewith and supporting said corresponding group of said fingers thereon in a forward position so that the front ends of the fingers of said corresponding group are positioned to contact the printed circuit board to be tested, the remainder of said fingers not included in said group of fingers extending through the remainder of said holes not included in said selected group of said holes so as to be withdrawn from said forward position; and
printed circuits printed on said contact selecting plate in electrical contact with said plugs, for electrically connecting said plugs with the test equipment.

7. A device as in claim 6, further comprising means for replaceably supporting said contact selecting plate in said opposing position.

8. A device as in claim 7, wherein said plugs comprise solder closing said selected group of holes.

9. A device as in claim 6, wherein said plugs comprise solder closing said selected group of holes.

10. A device as in claim 9, wherein said printed circuit is printed on a side of said contact selecting plate facing away from said contact bearing plate in electrical contact with said plated holes so as to be electrically connected to said plugs through the plated holes of said selected group.

11. A device as in claim 6, wherein said printed circuit is printed on a side of said contact selecting plate facing away from said contact bearing plate in electrical contact with said plated holes so as to be electrically connected to said plugs through the plated holes of said selected group.

12. A device as in claim 6, further comprising conductive paths printed onto said contact selecting plate and extending to an edge of said contact selecting plate so as to form taps.

13. A device as in claim 6, further comprising means for spring biasing said fingers toward said contact selecting plate.

* * * * *